(12) United States Patent  
Nah et al.

(10) Patent No.: US 8,759,961 B2
(45) Date of Patent: Jun. 24, 2014

(54) UNDERFILL MATERIAL DISPENSING FOR STACKED SEMICONDUCTOR CHIPS

(75) Inventors: Jae-Woong Nah, New York, NY (US); Katsuyuki Sakuma, Fishkill, NY (US); Bucknell C. Webb, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/567,567

(22) Filed: Aug. 6, 2012

(65) Prior Publication Data

US 2014/0013606 A1 Jan. 16, 2014

Related U.S. Application Data

(63) Continuation of application No. 13/549,848, filed on Jul. 16, 2012, now abandoned.

(51) Int. Cl.
*H01L 23/02* (2006.01)

(52) U.S. Cl.
USPC ........... 257/686; 257/698; 257/738; 257/762; 257/717; 438/118; 438/107; 438/123; 438/126

(58) Field of Classification Search
USPC ................. 257/686, 698, 738, 762, 777, 717; 438/118, 107, 123, 126
See application file for complete search history.

(56) References Cited

U.S. PATENT DOCUMENTS

| | | | |
|---|---|---|---|
| 5,817,545 A | 10/1998 | Wang et al. | |
| 6,000,924 A | 12/1999 | Wang et al. | |
| 6,644,238 B2 | 11/2003 | Watts et al. | |
| 6,756,251 B2 | 6/2004 | Lee | |
| 6,895,666 B2 | 5/2005 | Hong et al. | |
| 7,087,994 B2 | 8/2006 | Lee | |
| 7,838,336 B2 | 11/2010 | Bartley et al. | |
| 8,053,283 B2* | 11/2011 | Gruber et al. | 438/118 |
| 8,272,120 B2* | 9/2012 | Gruber et al. | 29/729 |
| 8,274,143 B2* | 9/2012 | Fujishima et al. | 257/686 |
| 8,310,063 B2* | 11/2012 | Wang | 257/777 |
| 2006/0234427 A1 | 10/2006 | Odegard et al. | |
| 2006/0289203 A1* | 12/2006 | Oda | 174/264 |
| 2007/0000592 A1 | 1/2007 | Fares et al. | |
| 2008/0085573 A1 | 4/2008 | Odegard et al. | |
| 2008/0257596 A1* | 10/2008 | Kaneko | 174/264 |

(Continued)

OTHER PUBLICATIONS

Gilleo, K. et al., "Molded Underfill for Flip Chip in Package" Molded Underfills (Jun. 2000) pp. 28-31, www.hdi-online.com.

*Primary Examiner* — Telly Green
(74) *Attorney, Agent, or Firm* — Scully, Scott, Murphy & Presser, P.C.; Louis J. Percello, Esq.

(57) ABSTRACT

A template having tapered openings can be employed to enable injection of underfill material through gaps having a width less than a lateral dimension of an injector needle for the underfill material. Each tapered opening has a first lateral dimension on an upper side and a second lateral dimension on a lower side. Compliant material portions can be employed to accommodate variations in distance between the template and stacked semiconductor chips and/or an injector head. Optionally, another head can be employed to apply compressed gas to push out the underfill material after the underfill material is applied to the gaps. Multiple injector heads can be employed to simultaneously inject the underfill material at different sites. An adhesive layer can be substituted for the at least one lower compliant material portion.

18 Claims, 19 Drawing Sheets

(56) References Cited

U.S. PATENT DOCUMENTS

| | | |
|---|---|---|
| 2009/0079060 A1 | 3/2009 | Bartley et al. |
| 2010/0203676 A1* | 8/2010 | Theuss et al. .................. 438/109 |
| 2011/0233762 A1* | 9/2011 | Gruber et al. .................. 257/737 |
| 2011/0237030 A1* | 9/2011 | Gruber et al. .................. 438/111 |

* cited by examiner

UNDERFILL MATERIAL DISPENSING FOR STACKED SEMICONDUCTOR CHIPS

CROSS REFERENCE TO RELATED APPLICATION

This application is a continuation of U.S. patent application Ser. No. 13/549,848, filed Jul. 16, 2012 the entire content and disclosure of which is incorporated herein by reference.

BACKGROUND

The present disclosure relates to methods of dispensing underfill material for stacked semiconductor chips, and structures for effecting the same.

In three-dimensional stacked structures including a plurality of semiconductor chips attached to a substrate, it is preferred that the gap among the plurality of semiconductor chips be as small as possible in order to minimize unused area of the substrate. The substrate can be a interposer substrate or a packaging substrate. Reduction of the gap between neighboring semiconductor chips increases the percentage of the area of the substrate that is used for stacking semiconductor chips, and thus, reduces manufacturing cost.

As the width of the gap decreases, however, it becomes difficult to fill the gap with the underfill material through underfill dispensing methods known in the art. Particularly, when the gap becomes smaller than the diameter of a needle of an underfill dispenser, the needle cannot be inserted into the gap for effective dispensing of the underfill material.

BRIEF SUMMARY

A template having tapered openings can be employed to enable injection of underfill material through gaps having a width less than a lateral dimension of an injector needle for the underfill material. Each tapered opening has a first lateral dimension on an upper side and a second lateral dimension on a lower side. At least one lower compliant material portion can be employed to accommodate variations in distance between the template and stacked semiconductor chips bonded to a substrate, and an upper compliant material portion can be employed to seal an injector head against top surfaces of the stacked semiconductor chips. Optionally, another head can be employed to apply compressed gas to push out the underfill material after the underfill material is applied to the gaps. Multiple injector heads can be employed to simultaneously inject the underfill material at different sites. An adhesive layer can be substituted for the at least one lower compliant material portion.

According to an aspect of the present disclosure, a method of processing a bonded structure is provided. A template is disposed over a plurality of semiconductor chips in a bonded structure. The plurality of semiconductor chips is bonded to a substrate within the bonded structure. The template includes a plurality of template openings extending between a proximal surface and a distal surface of the template. Each of the plurality of template openings has a first lateral dimension at the proximal surface and has a second lateral dimension that is greater than the first dimension at the distal surface. The distal surface is more distal from the bonded structure than the proximal surface. An injector head is disposed over a template opening among the plurality of template openings. An underfill material is dispensed from the injector head, through the template opening, and into a gap within the bonded structure.

According to another aspect of the present disclosure, a structure includes a bonded structure, which includes a plurality of semiconductor chips bonded to a substrate. The structure further includes a template disposed over the bonded structure. The template includes a plurality of template openings extending between a proximal surface and a distal surface of the template. Each of the plurality of template openings has a first lateral dimension at the proximal surface and has a second lateral dimension that is greater than the first dimension at the distal surface. The distal surface is more distal from the bonded structure than the proximal surface.

According to yet another aspect of the present disclosure, a structure includes at least a template. The template includes a plurality of template openings extending between a first surface and a second surface of the template. Each of the plurality of template openings has a first lateral dimension at the first surface and has a second lateral dimension that is greater than the first dimension at the second surface. The plurality of template openings is a two-dimensional periodic array of openings having a periodicity in two horizontal directions.

DETAILED DESCRIPTION

Figure 1:
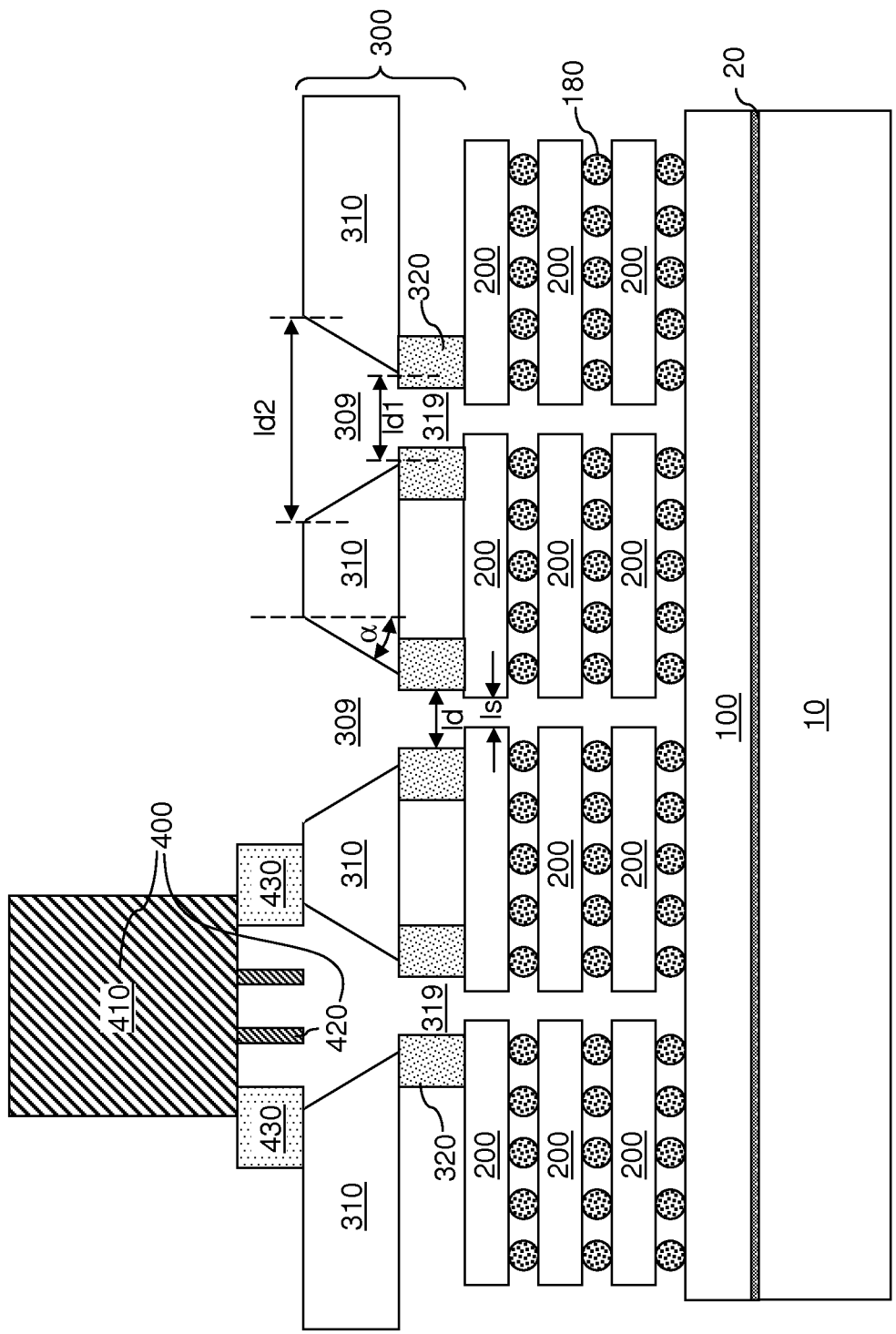
FIG. 1 is a vertical cross-sectional view of a first exemplary structure including a plurality of semiconductor chips bonded to a substrate, a template, a lower compliant material layer, an upper compliant material portion, and an injector head according to a first embodiment of the present disclosure.

As stated above, the present disclosure relates to methods of dispensing underfill material for stacked semiconductor chips, and structures for effecting the same, which are now described in detail with accompanying figures. It is noted that like and corresponding elements are referred to by like reference numerals. The drawings are not drawn to scale.

Referring to FIG. 1, a first exemplary structure according to a first embodiment of the present disclosure includes a bonded structure, which includes at least a substrate 100 and a plurality of semiconductor chips 200. The plurality of semiconductor chips 200 is bonded to the substrate 100 either directly through solder balls 180 or indirectly through at least one intervening semiconductor chip and at least two arrays of solder balls 180 located at different levels. The substrate 100 can be a interposer substrate with through-substrate vias (TSVs), a semiconductor substrate, or a packaging substrate as known in the art. The lateral extent of the substrate 100 is selected such solder balls 180 bonded directly to the substrate 100 are also directly bonded to at least two semiconductor chips among the plurality of semiconductor chips 200. The solder balls 180 can be Controlled Collapse Chip Connect (C4) balls as known in the art.

Optionally, the bonded structure can further include a handle substrate 10 and an intermediate bonding layer 20. In addition the bonded structure may further include an intermediate bonding layer 20. The substrate 100 can be bonded to the handle substrate 10 directly, or through the intermediate bonding layer 20, which can be, for example, an adhesive layer. The handle substrate 10 can be a semiconductor substrate, an insulator substrate, a conductive substrate, or a combination thereof. The handle substrate 10 can provide mechanical support to the substrate 100 during subsequent handling of the bonded structure (100, 180, 200, 10, 20).

The plurality of semiconductor chips 200 is grouped into subsets of semiconductor chips 200 such that each subset occupies a same area. Thus, if a subset of semiconductor chips 200 includes multiple semiconductor chips 200, all semiconductor chips 200 within the same subset overlie or underlie one another. Prior to being bonded to the substrate 100, the subsets of semiconductor chips 200 are arranged over the substrate 100 such that each subset of semiconductor chips 200 is laterally spaced from neighboring subsets of semiconductor chips 200 by a lateral spacing. The lateral spacing is of the lateral gap between each pair of neighboring subsets of semiconductor chips 200 can be from 0.1 mm to 3 mm, although lesser and greater lateral spacings can also be employed.

A compliant material layer 320 is disposed on the top surfaces of the plurality of semiconductor chips 200. The compliant material layer 320 includes a compliant material, which is an elastic material, i.e., a material that recovers an original shape after deformation once the force that introduces the deformation is removed. In one embodiment, the compliant material layer 320 can include a material having Young's modulus less than 1.0 GPa, which can be, for example, rubber, silicone, or polytetrafluoroethylene. In another embodiment, the compliant material layer 320 can include a material having Young's modulus less than 0.2 GPa, which can be, for example, rubber. The thickness of the compliant material layer 320 can be, for example, from 0.5 mm to 1 cm, although lesser and greater thicknesses can also be employed.

The compliant material layer 320 includes at least one compliant material portion, which is herein referred to as at least one lower compliant material portion. The compliant material layer 320 can be a single layer including a plurality of holes, or a collection of disjoined lower compliant material portions.

The openings in the compliant material layer 320 include openings that overlie the spaces between neighboring pair of subsets of semiconductor chips 200, i.e., openings that overlie the lateral spacings. The openings in the compliant material layer 320 are herein referred to as compliant material openings 319. In one embodiment, each compliant material opening 319 can be wider than an underlying lateral spacing. In one embodiment, the plurality of compliant material openings 319 can have a lateral dimension ld that is greater than the lateral spacing is among the plurality of semiconductor chips 200.

For example, the width of the openings in the compliant material layer 320 can be, for example, from 1 mm to 2 cm, although lesser and greater widths can also be employed. In one embodiment, the compliant material layer 320 can include a plurality of compliant material openings 319 that overlie lateral gaps among the plurality of semiconductor chips 200. In one embodiment, each overlying compliant material opening 319 can overlap the entirety of the area of the underlying lateral gap between a neighboring pair of subsets of semiconductor chips 200.

A template 310 is disposed on an upper surface of the compliant material layer 320. The template 310 includes a rigid material, which can be, for example, a semiconductor material, an insulator material, or a conductive material. For example, the template 310 can include silicon, glass, a ceramic material, a metallic material, or a combination thereof. The thickness of the compliant material layer 320 can be from 1 mm to 2 cm, although lesser and greater thicknesses can also be employed. In one embodiment, the plurality of template openings can overlie the plurality of compliant material openings 319 upon disposing of the template 310 on the compliant material layer 320.

The template 310 includes a plurality of template openings 309. Each of the plurality of template openings 309 extends from a horizontal surface that is proximal to the bonded structure (10, 20, 100, 180, 200) to a horizontal surface that is distal from the bonded structure (10, 20, 100, 180, 200). The horizontal surface of the template 310 that is proximal to the bonded structure (10, 20, 100, 180, 200) is herein referred to as a proximal surface, and the horizontal surface of the template 310 that is distal from the bonded structure (10, 20, 100, 180, 200) is herein referred to as a distal surface. Thus, the distal surface is more distal from the bonded structure (10, 20, 100, 180, 200) than the proximal surface. Each of the plurality of template openings 309 has a first lateral dimension ld1 at the proximal surface, and has a second lateral dimension ld2 that is greater than the first lateral dimension ld1 at the distal surface.

In one embodiment, each of the plurality of template openings 309 can have a non-zero taper angle $\alpha$ relative to the surface normal of the distal surface between the distal surface and the proximal surface. The non-zero taper angle $\alpha$ can have a value between, and excluding, 0 degree and 90 degrees. In one embodiment, the non-zero taper angle $\alpha$ can have a value between, and including, 10 degrees and 80 degrees. In one embodiment, the non-zero taper angle $\alpha$ can have a value between, and including, 20 degrees and 70 degrees. In one embodiment, the non-zero taper angle $\alpha$ can have a value between, and including, 30 degrees and 60 degrees. In one embodiment, each of the plurality of template openings 309 can overlie one of the plurality of compliant material openings 319.

The compliant material layer 320 and the template 310 can be provided as two separate structures that are disposed separately on the bonded structure (10, 20, 100, 180, 200), or can be provided as a pre-assembled structure that is attached to each other, either temporarily or permanently, prior to placing on the top surface of the plurality of semiconductor chips 200. The assembly of the compliant material layer 320 and the template 310 is herein referred to as a template assembly 300. The plurality of template openings 309 can be a two-dimensional periodic array of openings having a periodicity in two horizontal directions. The plurality of compliant material openings 319 can have the same periodicity in the two horizontal directions as the plurality of template openings 309.

Each of the plurality of template openings 309 extends between a first surface, i.e., the proximal surface, and a second surface, i.e., the distal surface. Each of the plurality of template openings 309 can have a first lateral dimension ld1 at the first surface, and can have a second lateral dimension ld2 that is greater than the first lateral dimension ld2 at the second surface. The plurality of template openings 309 can be a two-dimensional periodic array of openings having a periodicity in two horizontal directions.

An injector head 400 can be provided over the template assembly 300. The injector head 400 can include an injector tip 420 and an injector manifold 410 configured to hold an underfill material prior to injection. The injector head 400 is configured to extrude, i.e., inject, the underfill material from the injector manifold 410 through the injector head 420 into the space underlying the injector head 420. The underfill material can be any underfill material as known in the art.

In one embodiment, the lateral dimension of an opening in the injector tip 420 can be greater than the lateral spacing is among the plurality of semiconductor chips 200. In one embodiment, the opening of the injector tip 420 can have a circular cross-sectional area, and the lateral dimension of the opening in the injector tip 420 can be the inner diameter of the injector tip 420.

The injector head 400 is disposed over a template opening among the plurality of template openings 309. Optionally, a compliant material portion 430 can be disposed between the template 310 and the injector head 400. The compliant material portion 430 can provide a seal between the template 310 and the injector head 400. The compliant material portion 430 includes a compliant material, i.e., an elastic material. In one embodiment, the compliant material portion 430 can include a material having Young's modulus less than 1.0 GPa, which can be, for example, rubber or polytetrafluoroethylene. In another embodiment, the compliant material portion 430 can include a material having Young's modulus less than 0.2 GPa, which can be, for example, rubber. The thickness of the compliant material portion 430 can be, for example, from 0.5 mm to 1 cm, although lesser and greater thicknesses can also be employed. In one embodiment, the compliant material portion 430 can be permanently affixed to a face of the injector head 400 that is proximal to the template 310. In one embodiment, the compliant material portion 430 can be ring-shaped, and can contact a periphery of a proximal face of the injector head 400 from which the injector top 420 protrudes.

Figure 2:
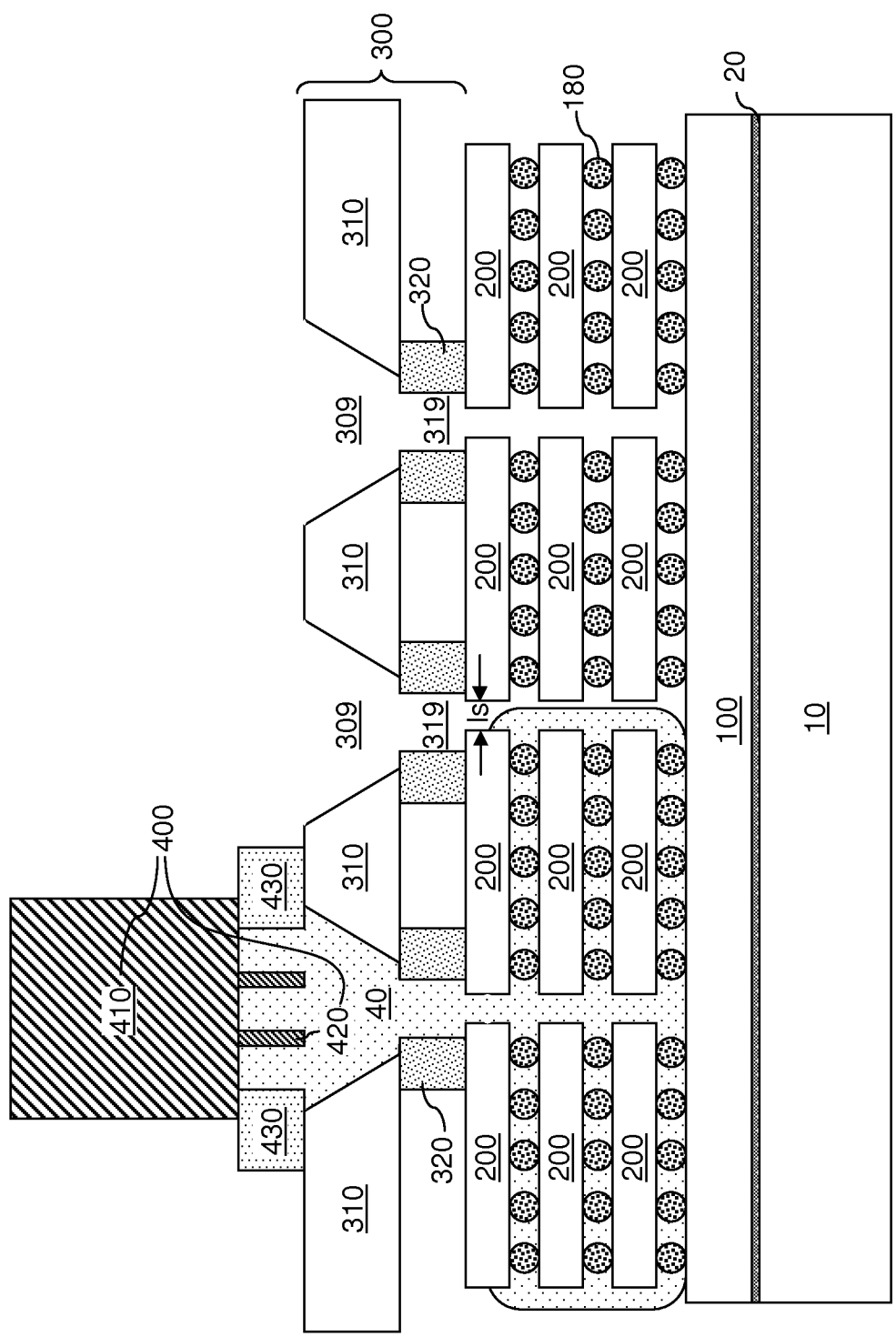
FIG. 2 is a vertical cross-sectional view of the first exemplary structure during injection of an underfill material according to the first embodiment of the present disclosure.

Referring to FIG. 2, the underfill material 40 can be dispensed while the compliant material portion 430 provides a seal between the template 310 and the injector head 400 and the compliant material layer 320 provides another seal between the template 310 and the plurality of semiconductor chips 200. The underfill material 40 is dispensed from the injector head 400, through the template opening 309 that underlies the injector head 400, and into a lateral gap within the bonded structure (10, 20, 100, 180, 200). The underfill material 40 flows through interface between the compliant material opening underneath the injector head 400 and the lateral gap underneath the compliant material opening, and flows into the various cavities among the plurality of semiconductor chips 200 in the vicinity of the interface. The underfill material extends at least from the template opening 309 and fills at least one lateral gap and at least one vertical gap within the bonded structure (10, 20, 100, 180, 200).

In one embodiment, the injector head 400 can apply pressure to the underfill material so as to facilitate the flow of the underfill material through the various cavities among the plurality of semiconductor chips 200. In one embodiment, vacuum environment may be employed to facilitate the flow of the underfill material.

In one embodiment, the lateral dimension of the opening in the injector tip 420 can be greater than the lateral dimension is of the lateral gaps between neighboring pairs of semiconductor chips 200 because the injector tip 420 does not need to be inserted into any of the lateral gaps.

The injector head 400 and the compliant material portion 430 can be moved from one compliant material opening 309 to other compliant material openings 309 until the underfill material 40 fills all of the cavities among the plurality of semiconductor chips 200. Subsequently, the injector head 400, the compliant material portion 430, and the template assembly 300 can be removed from above the bonded structure (10, 20, 100, 180, 200, 40), which includes the underfill material 40.

Figure 3:
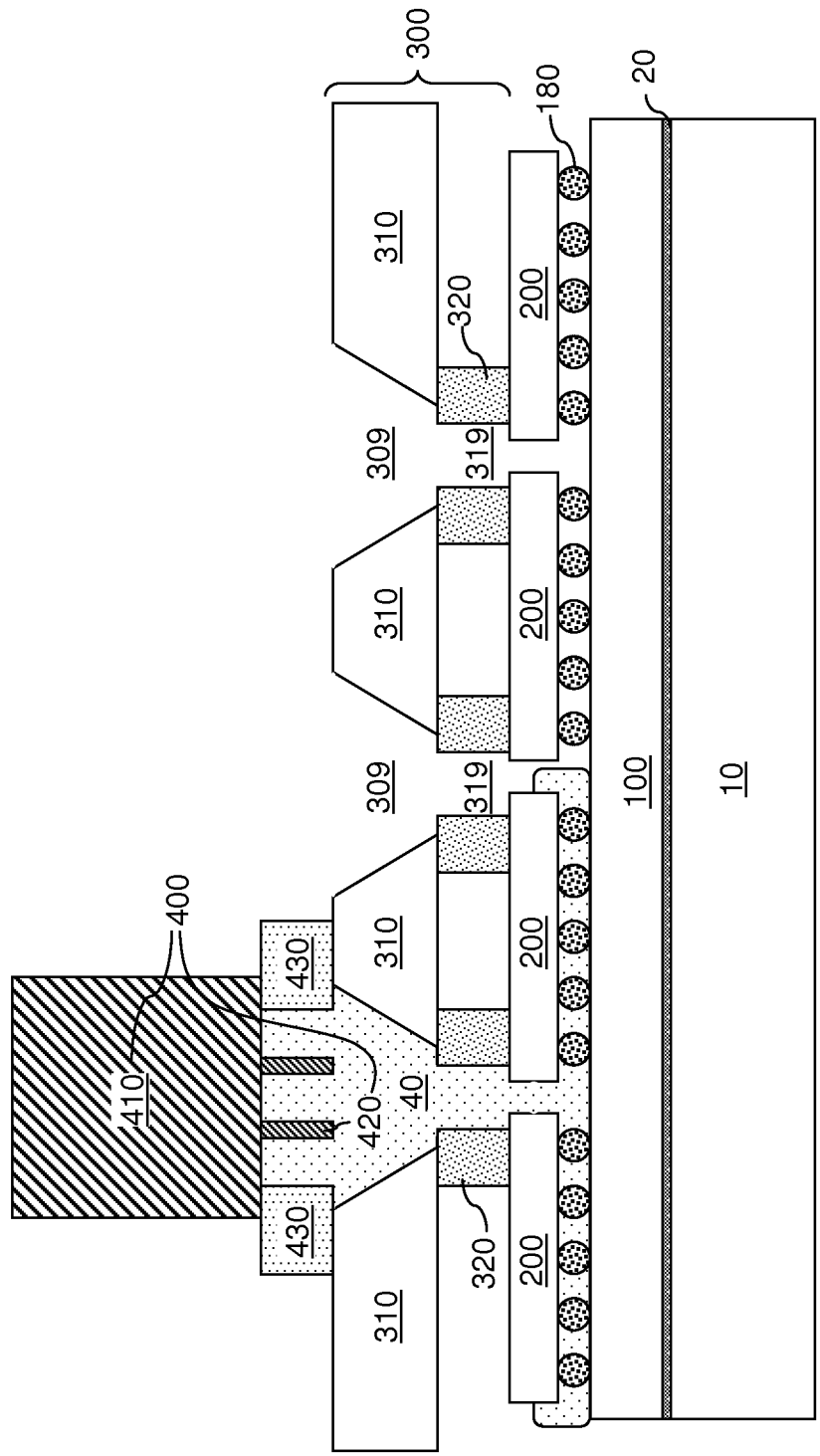
FIG. 3 is a vertical cross-sectional view of a variation of the first exemplary structure during injection of an underfill material according to the first embodiment of the present disclosure.

Referring to FIG. 3, a variation of the first exemplary structure can be derived from the first exemplary structure by bonding all of the plurality of semiconductor chips 200 directly to the substrate 100 through an array of solder balls 180 instead of forming a plurality of vertical stacks of two or more semiconductor chips 200.

Figure 4:
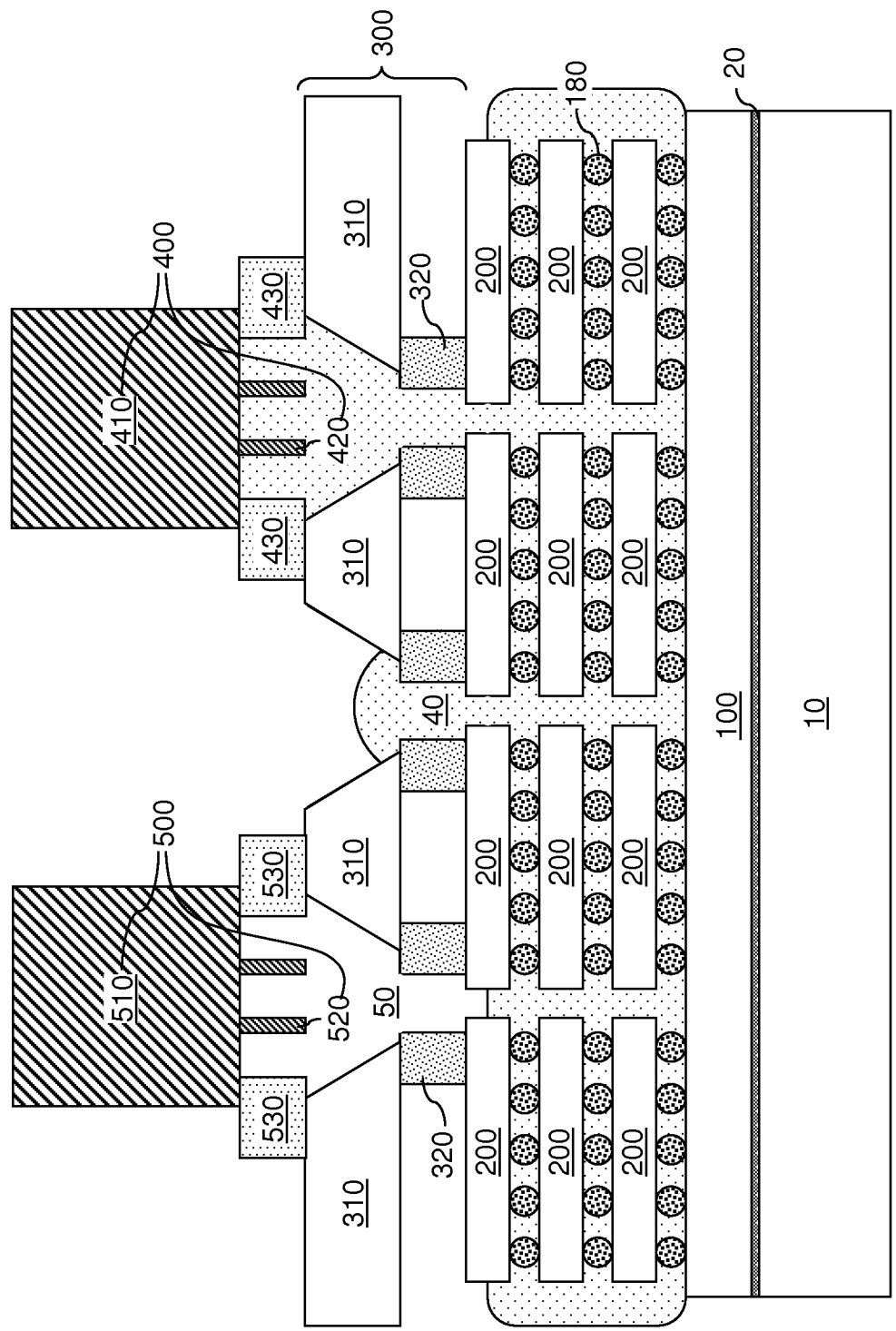
FIG. 4 is a vertical cross-sectional view of a second exemplary structure including a plurality of semiconductor chips bonded to a substrate, a template, a lower compliant material layer, an upper compliant material portion, an injector head, and compressed gas dispenser according to a second embodiment of the present disclosure.

Referring to FIG. 4, a second exemplary structure according to a second embodiment of the present disclosure can be derived from the first exemplary structure by adding a gas dispenser 500. Once the underfill material 40 is applied by the injector head 400 through a first compliant material opening 309, the injector head 400 can be moved and disposed over a second compliant material opening to inject additional underfill material 40. The gas dispenser 500 is placed over the first compliant material opening 309 after the underfill material is dispensed though the lateral gap underlying the first compliant material opening 309.

In one embodiment, the gas dispenser 500 can include a gas injector tip 520 or a gas injection opening located on a proximal face of a gas injection manifold 510. A compliant material portion, which is herein referred to as a gas-dispenser compliant material portion 530, can be disposed between the template 310 and the gas dispenser 500 to provide a seal between the gas dispenser 500 and the template 310. The gas flows through the gas dispenser 500, and is dispensed by the gas dispenser 500 into a cavity 50 confined by the gas dispenser 500, the gas-dispenser compliant material portion 530, the template 310, a top surface of the underfill material 40, and optionally the compliant material layer 320. The cavity 50 is filled with a pressurized gas, which is at a higher pressure relative to the pressure of the ambient in which the second exemplary structure is placed. In one embodiment, the pressure of the gas within the cavity 50 can be adjusted so that the top surface of the underfill material 40 underlying the cavity 50 is between a horizontal plane of a bottom surface of semiconductor chips 200 located at the topmost layer of semiconductor chips 200 and a horizontal plane including a top surface of the compliant material layer 320.

The gas dispenser 500 and the gas-dispenser compliant material portion 530 can be moved from one compliant material opening 309 to other compliant material openings 309 until the top surfaces of the underfill material 40 are placed between a horizontal plane of a bottom surface of semiconductor chips 200 located at the topmost layer of semiconductor chips 200 and a horizontal plane including a top surface of the compliant material layer 320. Subsequently, the injector head 400, the compliant material portion 430, the gas dispenser 500, the gas-dispenser compliant material portion 530, and the template assembly 300 can be removed from above the bonded structure (10, 20, 100, 180, 200, 40), which includes the underfill material 40.

Figure 5:
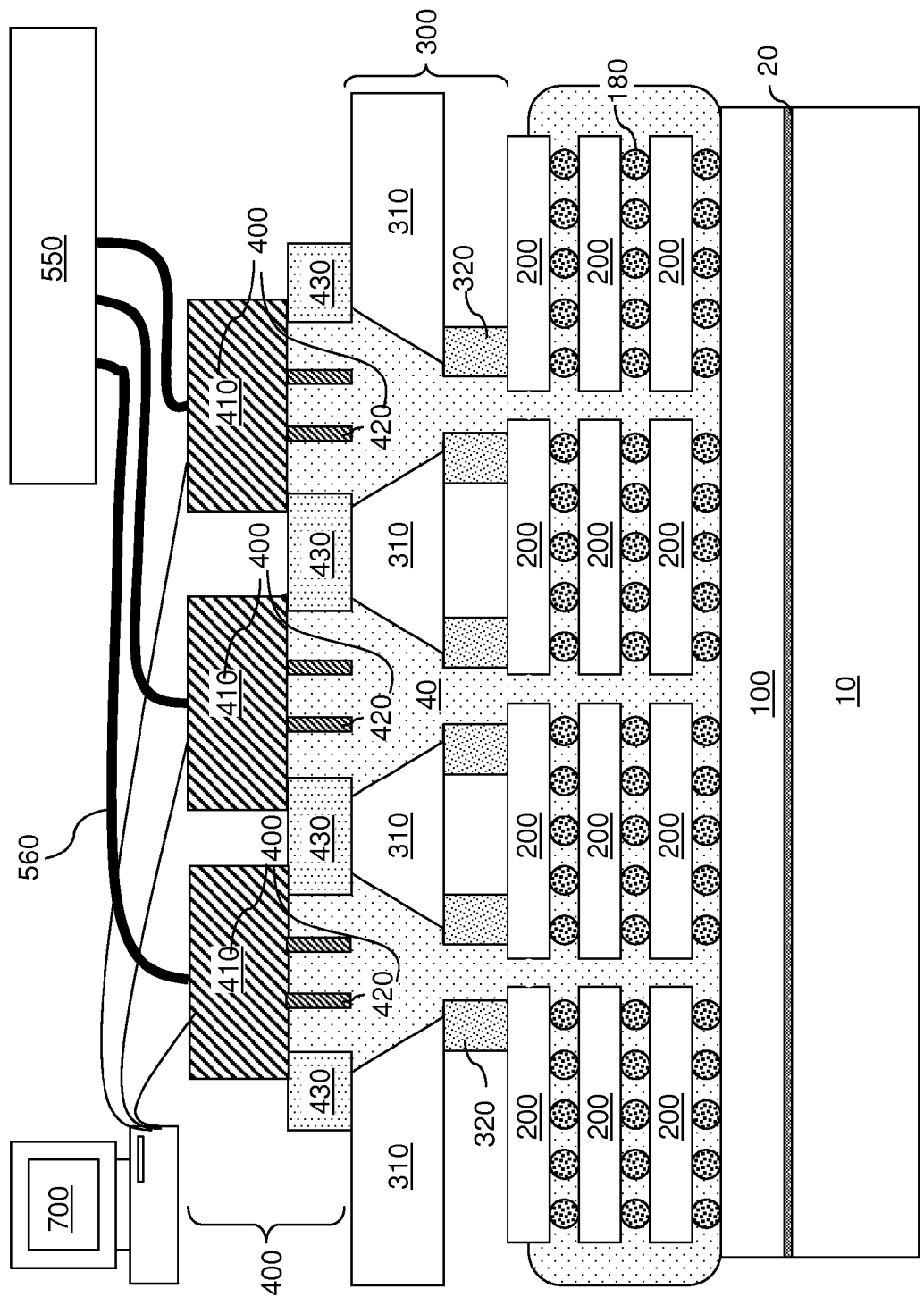
FIG. 5 is a vertical cross-sectional view of a third exemplary structure including a plurality of injector heads according to a third embodiment of the present disclosure.

Referring to FIG. 5, a third exemplary structure according to a third embodiment of the present disclosure can be derived from the first exemplary structure by substituting a plurality of injector heads 400 and a plurality of compliant material portions 430 for the combination of a single injector head 400 and a single compliant material portion 430. The plurality of injector heads 400 can be disposed over the plurality of template openings 309 (See FIG. 1) after placement of the plurality of compliant material portions 430 on the top surface of the template 310. The underfill material 40 can be simultaneously or sequentially dispensed from the plurality of injector heads 400, through the plurality of template openings 309, and into the lateral gaps among the plurality of semiconductor chips 200 within the bonded structure (10, 20, 100, 180, 200).

In one embodiment, the simultaneous or sequential dispensation of the underfill material 40 from the plurality of injector heads 400 can be controlled by a dispensing controller 700, which can include a computer and a communication interface system for controlling the injection of the underfill material through the injector manifolds 410. In one embodiment, an underfill material supply system can be provide, which can include, for example, an underfill material reservoir 550 that holds the underfill material 40 and underfill material transfer tubes 560 through which the underfill material 40 is transferred from the underfill material reservoir 550 to the injection manifolds 410. In one embodiment, the dispensing controller 700 can be configured to cause the injector heads 400 to simultaneously inject the underfill material 40. In another embodiment, the dispensing controller 700 can be configured to cause the injector heads 420 to sequentially inject the underfill material.

Figure 6:
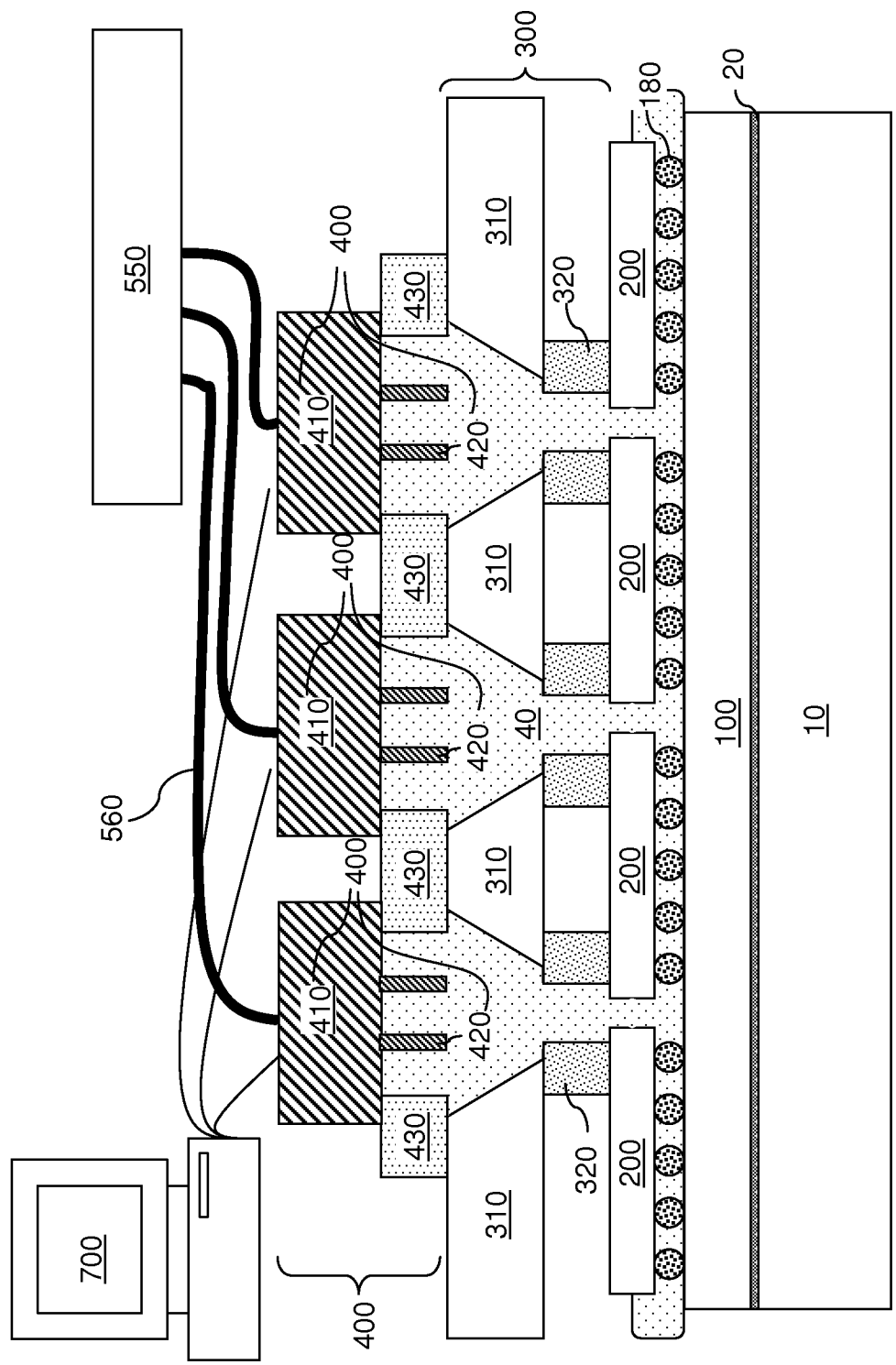
FIG. 6 is a variation of the third exemplary structure during injection of an underfill material according to the third embodiment of the present disclosure.

Referring to FIG. 6, a variation of the third exemplary structure can be derived from the third exemplary structure by bonding all of the plurality of semiconductor chips 200 directly to the substrate 100 through an array of solder balls 180 instead of forming a plurality of vertical stacks of two or more semiconductor chips 200.

Figure 7:
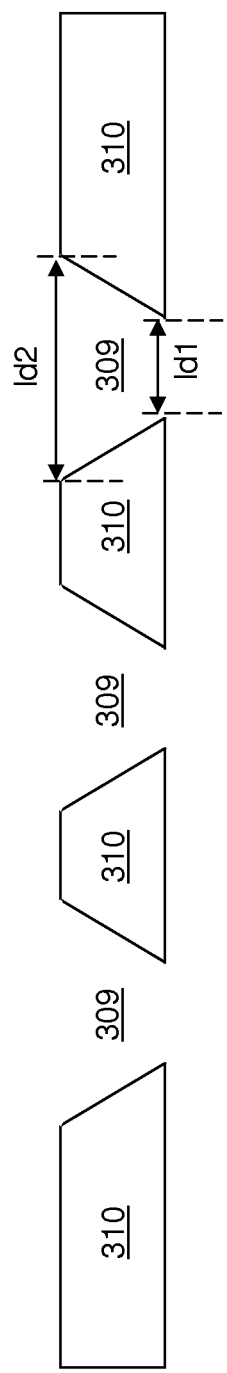
FIG. 7 is a vertical cross-sectional view of a fourth exemplary structure including a template according to a fourth embodiment of the present disclosure.

Referring to FIG. 7, a fourth exemplary structure according to a fourth embodiment of the present disclosure includes a template 310, which can be the same as the template 310 of the first, second, and third embodiments. The template 310 includes a plurality of template openings 309 extending between a first surface and a second surface. Each of the plurality of template openings 309 has a first lateral dimension ld1 at the first surface, and has a second lateral dimension ld2 that is greater than the first lateral dimension ld1 at the second surface. The plurality of template openings 309 can be a two-dimensional periodic array of openings having a periodicity in two horizontal directions. The template 310 can be provided as a stand-alone piece.

Figure 8:
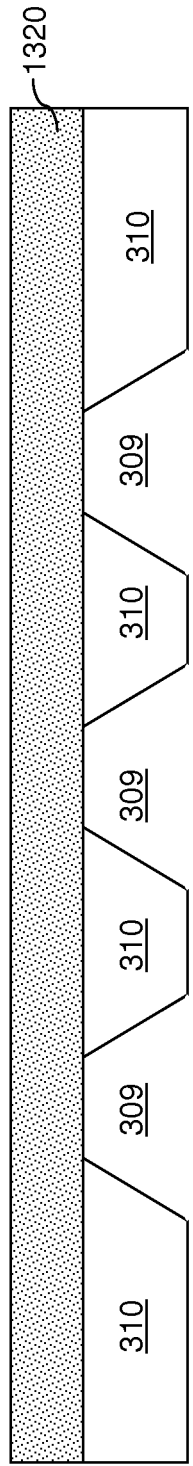
FIG. 8 is a vertical cross-sectional view of the fourth exemplary structure after application of an adhesive layer according to the fourth embodiment of the present disclosure.

Referring to FIG. 8, an adhesive layer 1320 is applied to first surface of the template 310. The adhesive layer 1320 can include any material that can provide adhesion to the template 310 and top surfaces of semiconductor chips to be subsequently attached to the adhesive layer 1320. In one embodiment, the adhesive layer 1320 can include an epoxy-based adhesive material. The thickness of the adhesive layer 1320 can be from 10 micron to 1 mm, although lesser and greater thicknesses can also be employed.

Figure 9:
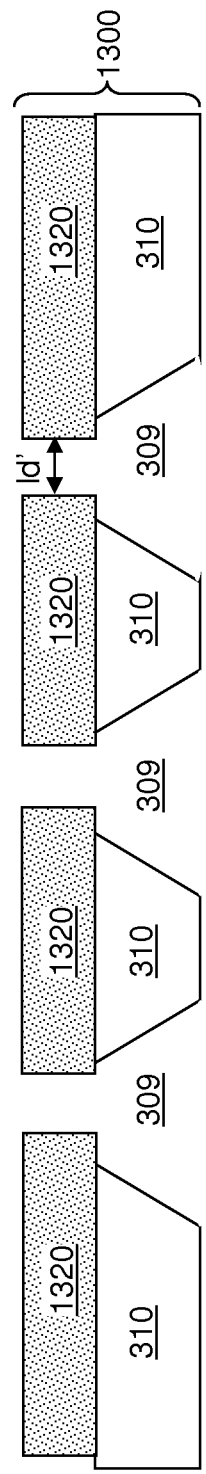
FIG. 9 is a vertical cross-sectional view of the fourth exemplary structure after formation of holes through the adhesive layer according to the fourth embodiment of the present disclosure.

Referring to FIG. 9, holes are formed through the adhesive layer 1320, for example, by employing at least one pointy mechanical structure, which can be, for example, one or more needles. In one embodiment, a plate including an array of needles can be employed to form the holes through the adhesive layer 1320. The openings in the adhesive layer 1320 are herein referred to as a plurality of adhesive layer openings. The plurality of adhesive layer openings overlies or underlies the plurality of template openings 309. In one embodiment, the first lateral dimension ld1 of the compliant material opening 319 can be greater than a lateral dimension ld' of the adhesive layer openings. In one embodiment, the lateral dimension of the adhesive layer openings can be the diameter of the hole. In one embodiment, the plurality of adhesive layer openings can have a lateral dimension ld' that is less than first lateral dimension ld1. For example, the lateral dimension ld' of the adhesive layer openings can be, for example, from 1 mm to 2 cm, although lesser and greater widths can also be employed.

Figure 10:
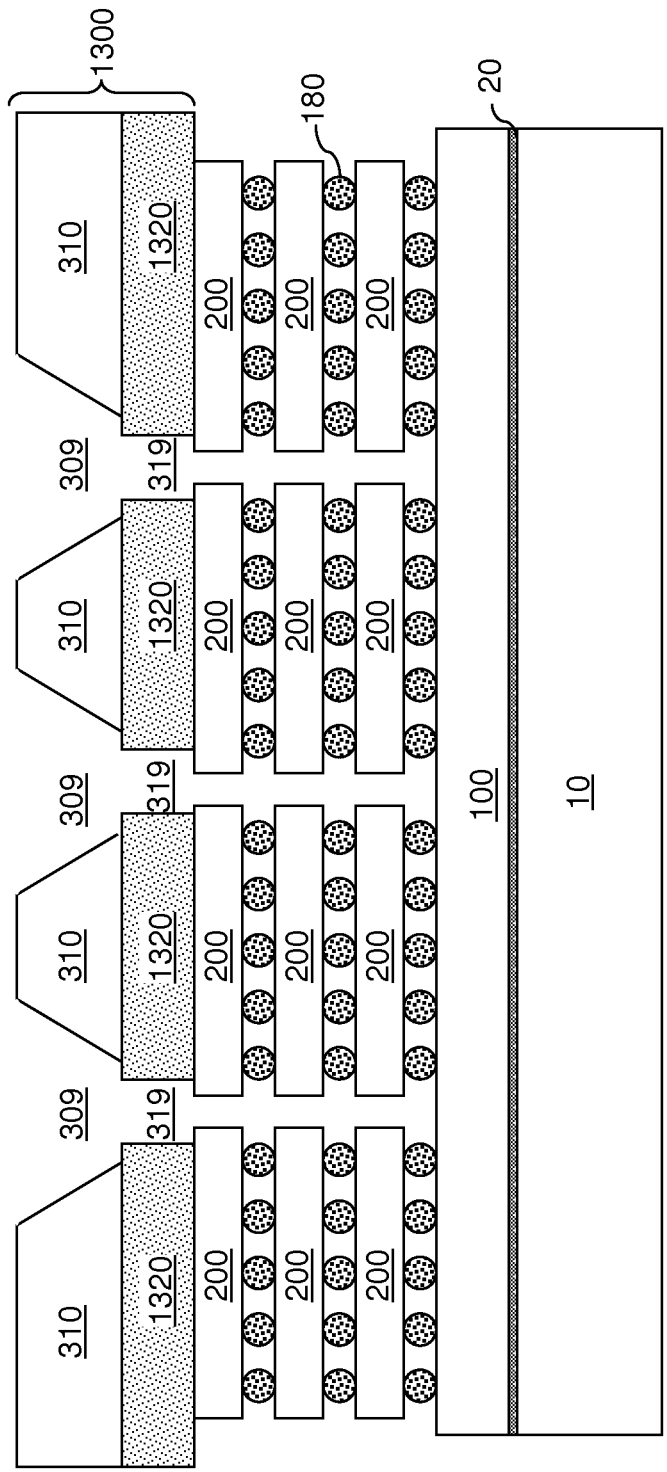
FIG. 10 is a vertical cross-sectional view of the fourth exemplary structure after attaching the adhesive layer to a stack of semiconductor chips bonded to a substrate according to the fourth embodiment of the present disclosure.

Referring to FIG. 10, the template 310 and the adhesive layer 1320 are aligned relative to a plurality of semiconductor chips 200 within a bonded structure (10, 20, 100, 180, 200). The bonded structure (10, 20, 100, 180, 200) can be the same as in the first, second, or third embodiments. The adhesive layer 1320 is subsequently attached to the bonded structure (100, 180, 200, 10, 20) that includes vertical stacks of semiconductor chips 200 and the substrate 100. The combination of the template 310 and the adhesive layer 1320 is aligned such that the plurality of adhesive layer openings overlies lateral gaps among the plurality of semiconductor chips 200 upon disposition, i.e., placement, of the template layer 310 over the plurality of semiconductor chips 200. Upon placement of the combination of the template 310 and the adhesive layer 1320 on the bonded structure (10, 20, 100, 180, 200), the adhesive layer 1320 contacts the topmost surfaces of the plurality of semiconductor chips 200.

The plurality of adhesive layer openings underlies the plurality of template openings 309. In one embodiment, the adhesive layer 1320 can include a plurality of adhesive layer openings that overlie lateral gaps among the plurality of semiconductor chips 200. In one embodiment, each of the adhesive layer openings can have a lateral dimension ld' (See FIG. 9) that is less than the first lateral dimension ld1 (See FIG. 7). In one embodiment, each overlying adhesive material opening can overlap the entirety of the area of the underlying lateral gap between a neighboring pair of subsets of semiconductor chips 200.

Figure 11:
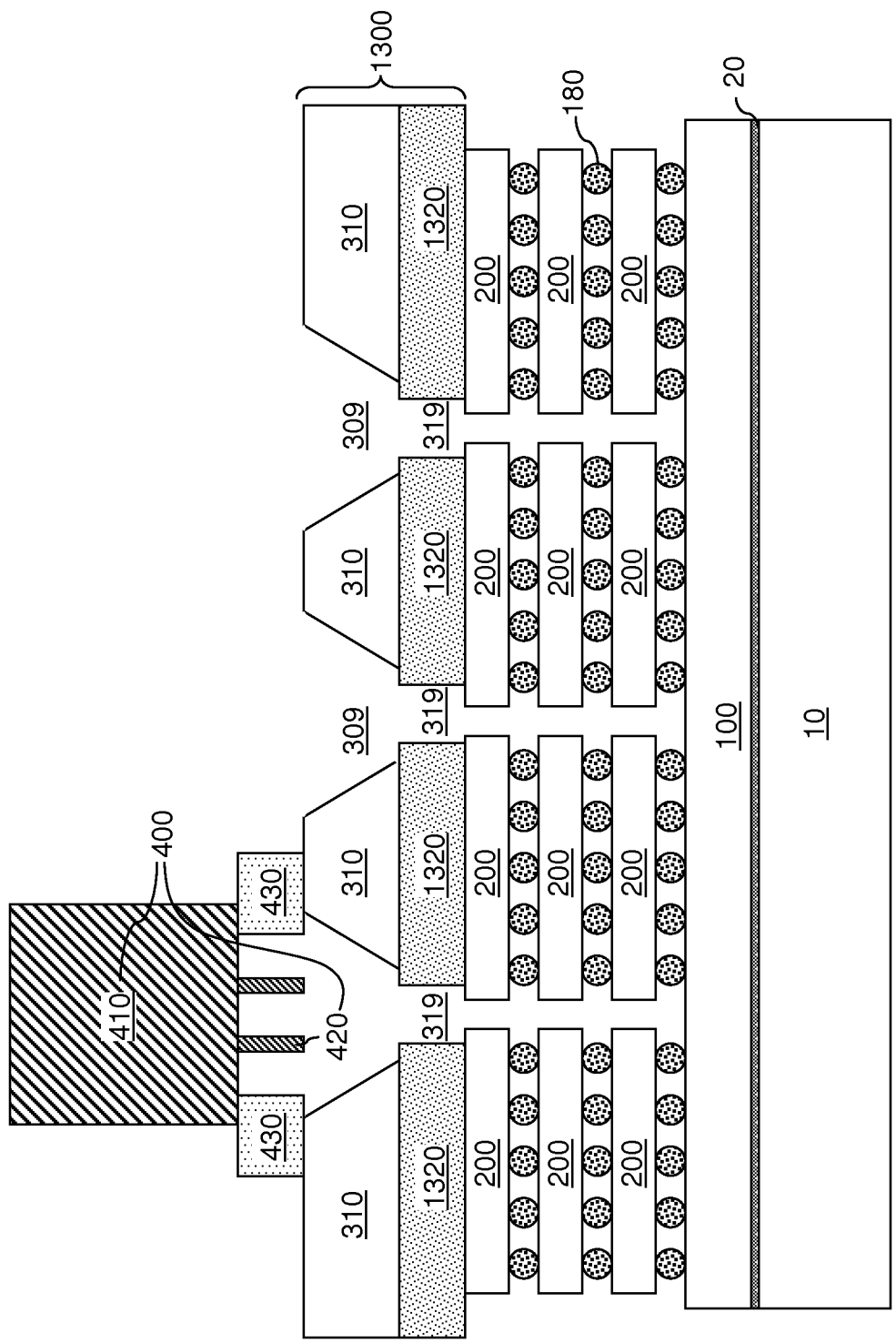
FIG. 11 is a vertical cross-sectional view of the fourth exemplary structure after placing an injector head on the template through an upper compliant material portion according to the fourth embodiment of the present disclosure.

Referring to FIG. 11, an injector head 400 and a compliant material portion 430 are placed over the template 310 in the same manner as in the first embodiment as illustrated in FIG. 1.

Figure 12:
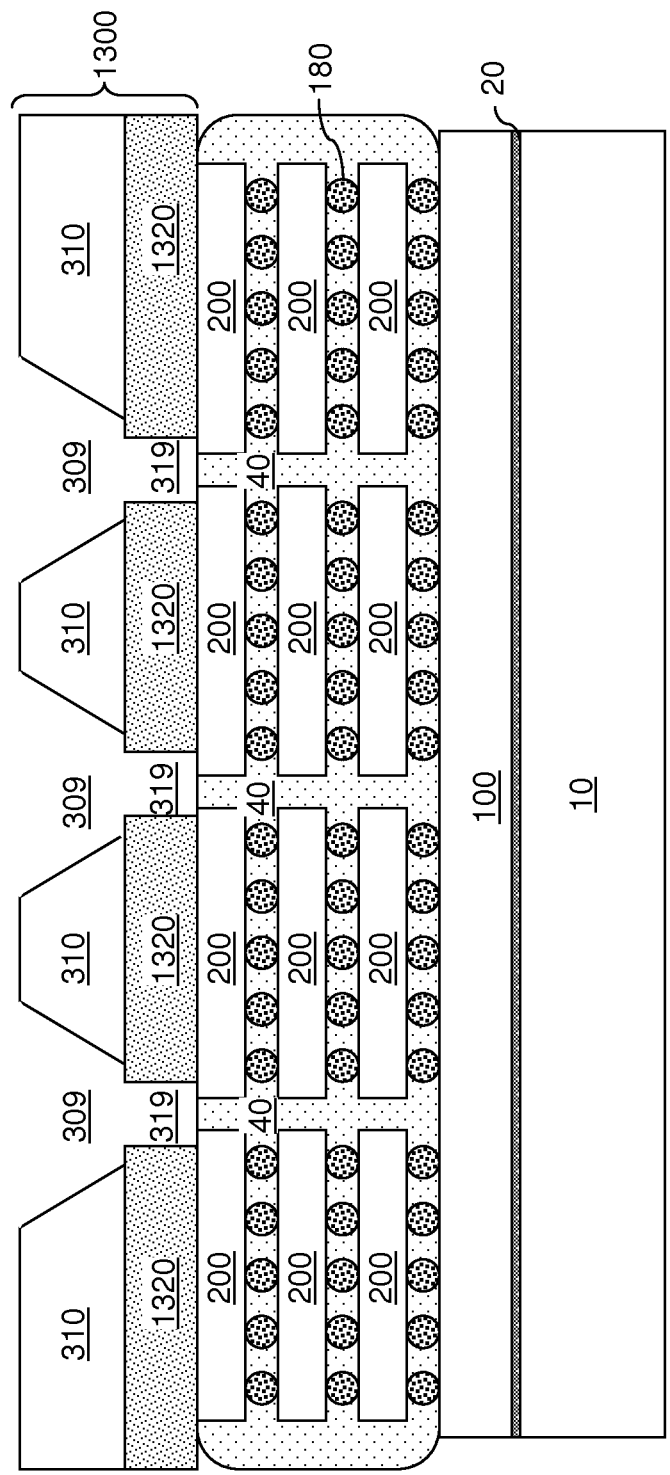
FIG. 12 is a vertical cross-sectional view of the fourth exemplary structure after application and curing of the underfill material according to the fourth embodiment of the present disclosure.

Referring to FIG. 12, the processing steps of FIG. 2 are performed to dispense the underfill material 40. The compliant material portion 430 and the injector head 400 are subsequently removed. The underfill material can be cured at an elevated temperature as needed.

Figure 13:
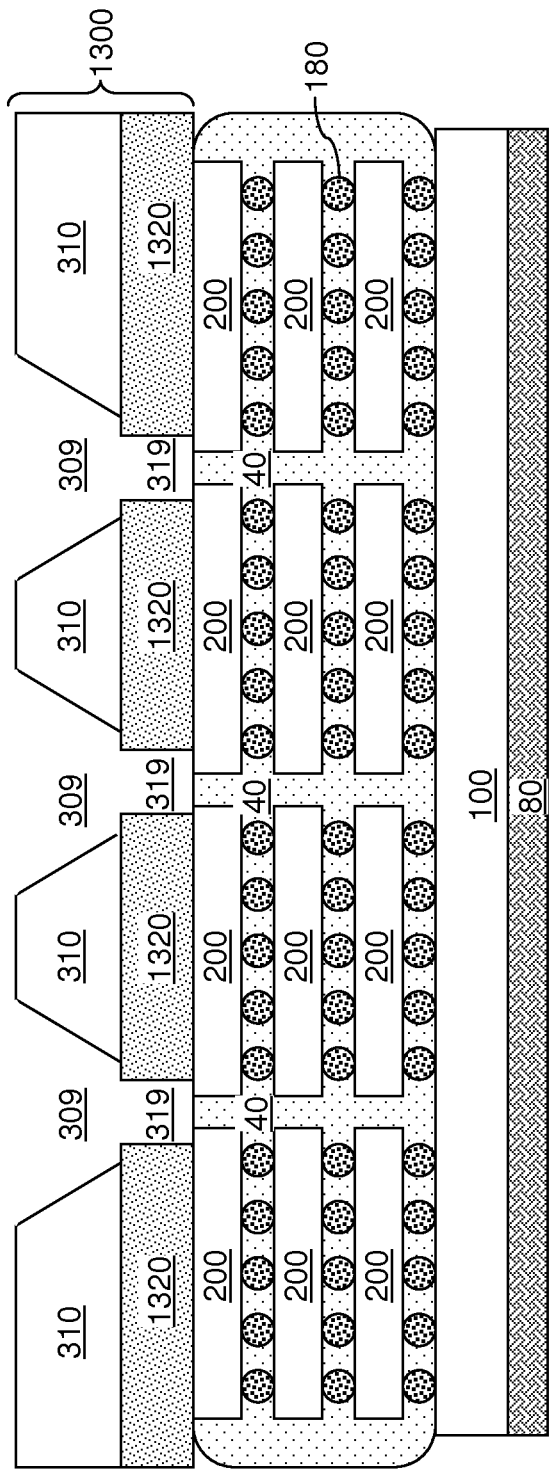
FIG. 13 is a vertical cross-sectional view of the fourth exemplary structure after removal of a handle substrate and formation of backside structures on the substrate according to the fourth embodiment of the present disclosure.

Referring to FIG. 13, the handle substrate 10 and the intermediate bonding layer 20 can be removed. The removal of the handle substrate 10 and the intermediate bonding layer 20 can be effected, for example, by detachment, grinding, etch, planarization, or combinations thereof. Patterned backside contact structures 80 can be formed on a surface of the substrate 100 that is physically exposed after the removal of the handle substrate 10, i.e., on the back side surface of the substrate 100. The patterned backside contact structures 80 can include, for example, bonding pads for a ball grid array (BGA), which can be employed to subsequently bond diced portions of the substrate 100 to a packaging substrate.

Figure 14:
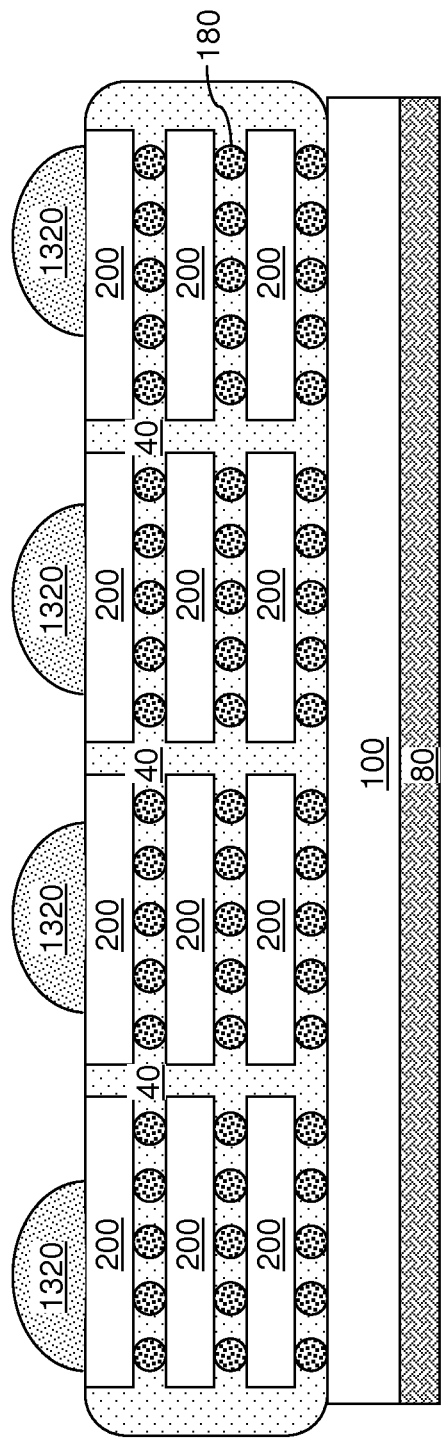
FIG. 14 is a vertical cross-sectional view of the fourth exemplary structure after detaching the template according to the fourth embodiment of the present disclosure.

Referring to FIG. 14, the template 310 can be detached from the adhesive layer 1320, for example, by a wet etch that etches the adhesive layer 1320 at least until the template is detached from the remaining portions of the adhesive layer 1320. If the adhesive layer 1320 includes an epoxy-based material, an organic solvent can be employed to selectively dissolve portions of the adhesive layer 1320 while not etching the semiconductor chips 200.

Figure 15:
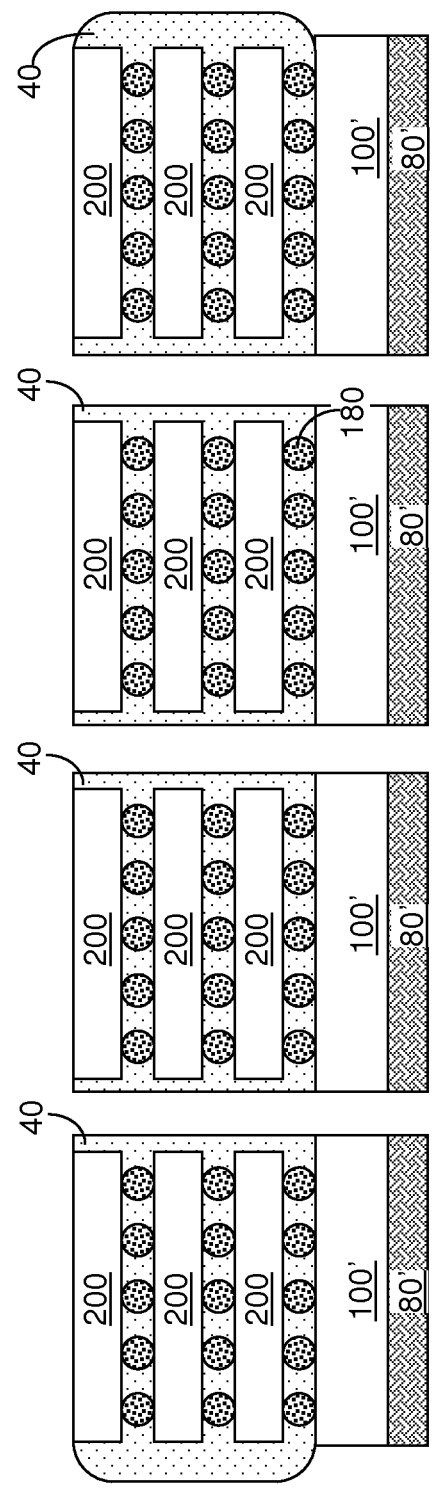
FIG. 15 is a vertical cross-sectional view of the fourth exemplary structure after dicing according to the fourth embodiment of the present disclosure.

Referring to FIG. 15, the fourth exemplary structure including the substrate 100, the plurality of semiconductor chips 200, and the dispensed underfill material 40 are diced by cutting through portions of the dispensed underfill material 40 within the fourth exemplary structure. In one embodiment, each diced structure of the fourth exemplary structure can include a diced interposer unit 100', a subset of the plurality of semiconductor chips 200 that are vertically stacked thereupon, arrays of solder balls 180 that provide vertical interconnections within the subset, and the underfill material 40, which can compensate for the mismatch in thermal expansion coefficients of different materials. Each diced portion of the fourth exemplary structure can be mounted, for example, on a packaging substrate (not shown) as known in the art.

Further, while the dicing operation is illustrated only for the fourth exemplary structure, any of the exemplary structures of the present disclosure can be diced to provide the diced structures illustrated in FIG. 15.

Figure 16:
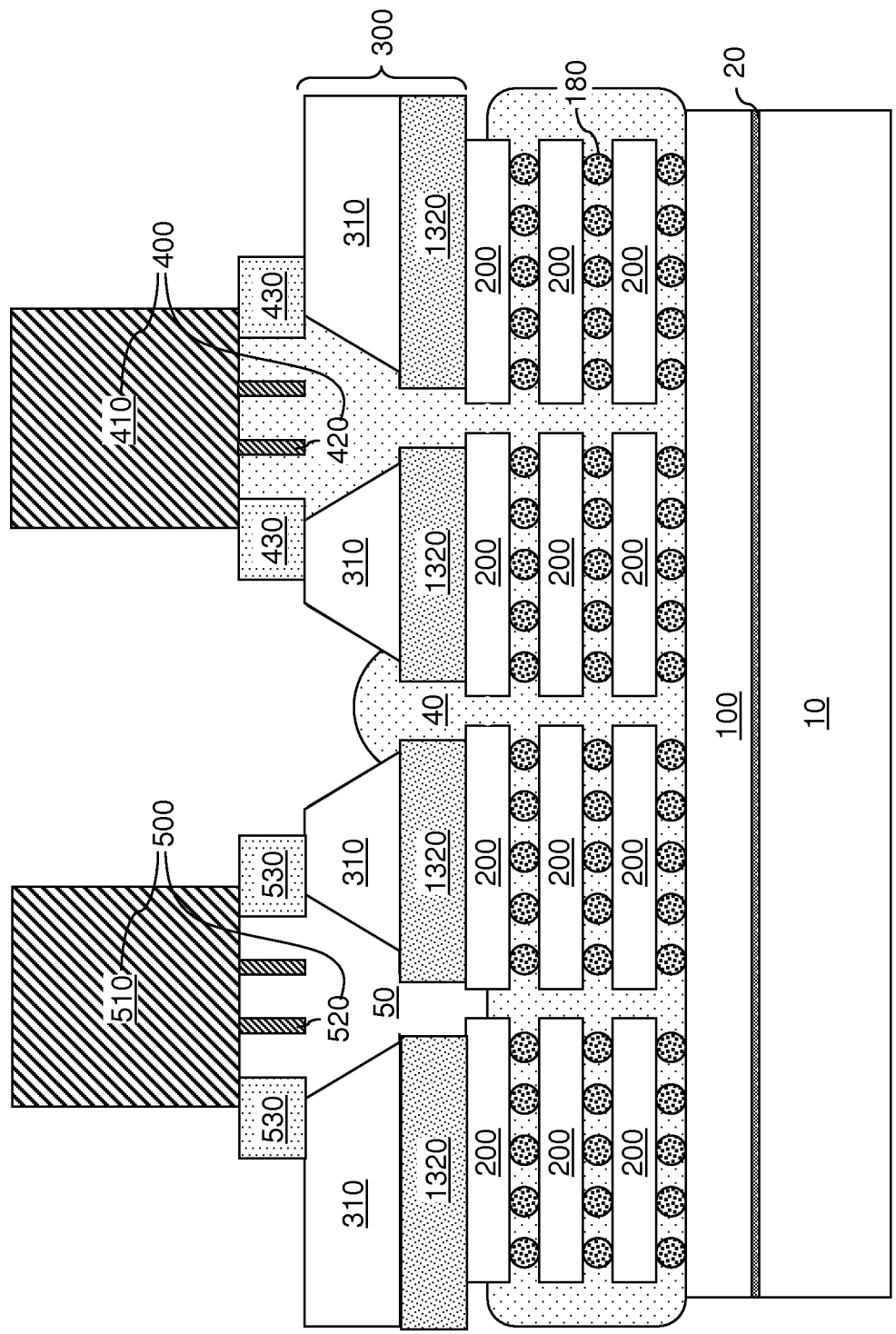
FIG. 16 is a vertical cross-sectional view of a fifth exemplary structure including a plurality of semiconductor chips bonded to a substrate, a template, an adhesive layer, an upper compliant material portion, an injector head, and compressed gas dispenser according to a fifth embodiment of the present disclosure.

Referring to FIG. 16, a fifth exemplary structure according to a fifth embodiment of the present disclosure can be derived from the fourth exemplary structure of FIG. 11 by employing the components of the second embodiment as described above. Specifically, a gas dispenser 500 and a gas-dispenser compliant material portion 530 can be added and operated as in the second embodiment.

Figure 17:
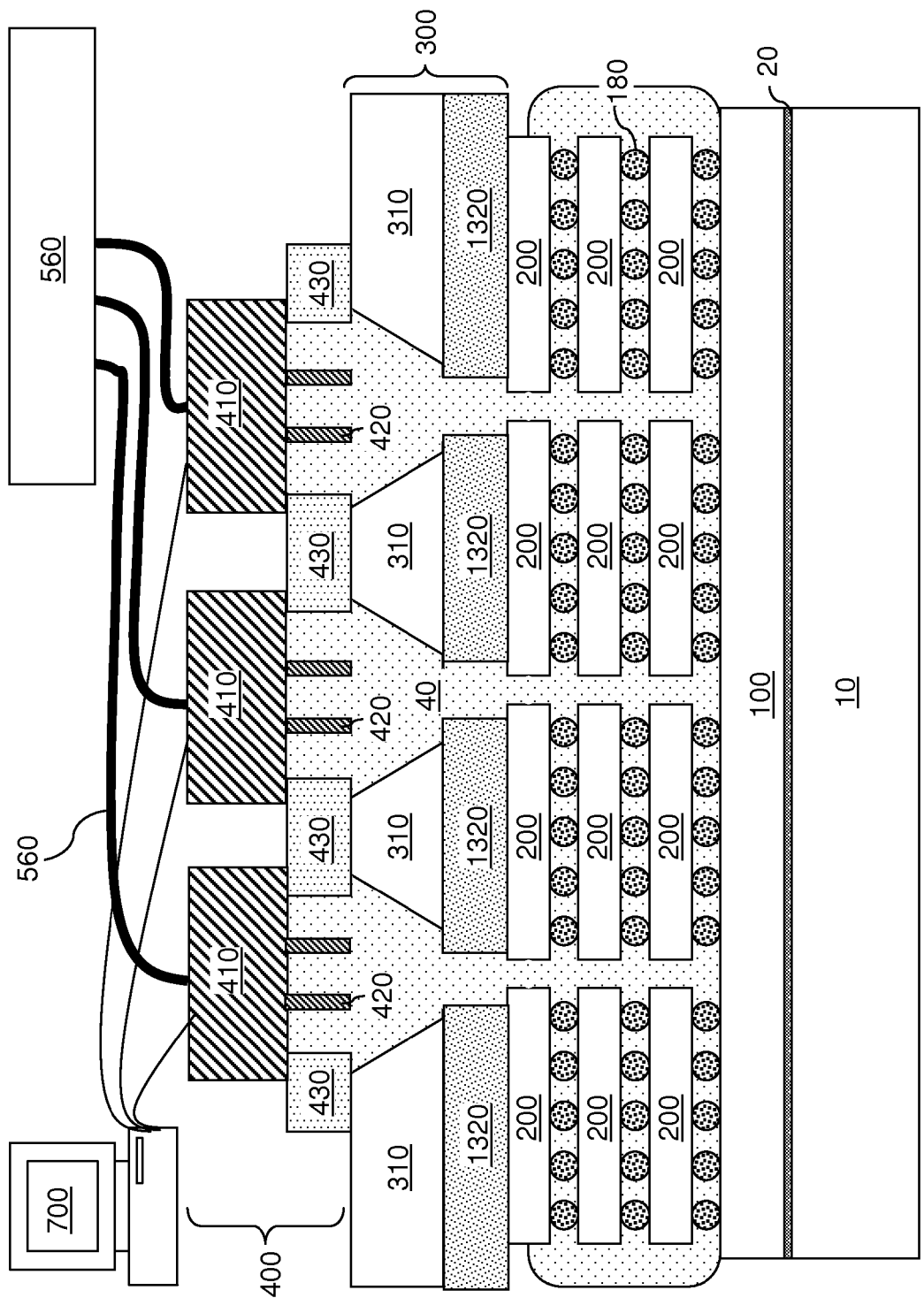
FIG. 17 is a vertical cross-sectional view of a third exemplary structure including a plurality of injector heads according to a sixth embodiment of the present disclosure.

Referring to FIG. 17, a sixth exemplary structure according to a sixth embodiment of the present disclosure can be derived from the fourth exemplary structure by substituting a plurality of injector heads 400 and a plurality of compliant material portions 430 for the combination of a single injector head 400 and a single compliant material portion 430 in the same manner as in the third embodiment. The plurality of injector heads 400, a dispensing controller 700, an underfill material reservoir 550, and underfill material transfer tubes 560 can be operated in the same manner as in the third embodiment.

Figure 18:
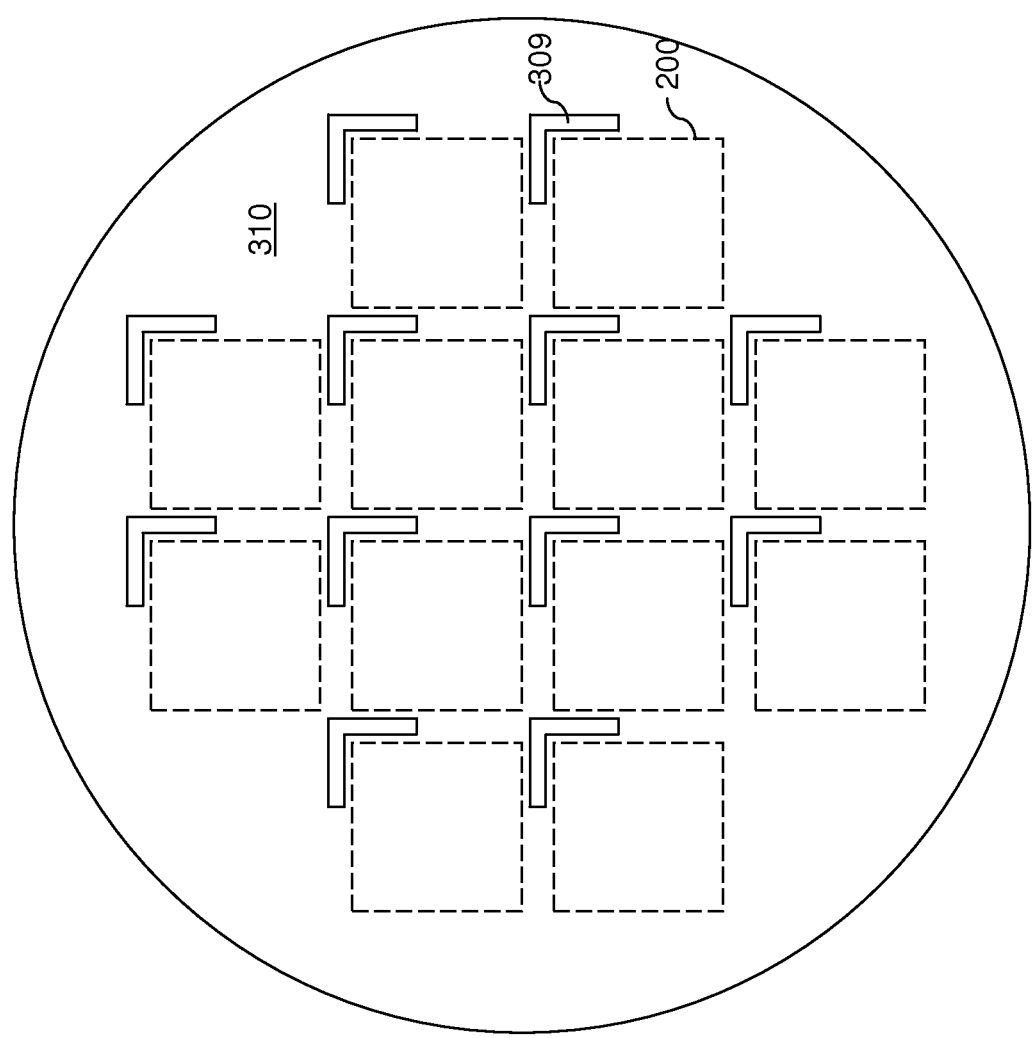
FIG. 18 is a top-down view of a first exemplary template according to an embodiment of the present disclosure.

Referring to FIG. 18, a template 310 according to an embodiment of the present disclosure includes a plurality of template openings 309, which is provided as a two-dimensional periodic array of openings having a periodicity in two horizontal directions. The width of each template openings 309 correspond to the first lateral dimension ld1. The locations of the plurality of semiconductor chips 200 are schematically illustrated with dotted lines, which do not correspond to the sidewalls of the semiconductor chips 200. In one embodiment, the plurality of template openings 309 may be located only at one corner of each semiconductor chip 200. Because the underfill material 40 can flow through the various vertical and lateral gaps among the semiconductor chips 200, it is not necessary to form the template openings 309 around the entire periphery of each topmost semiconductor chip 200.

Figure 19:
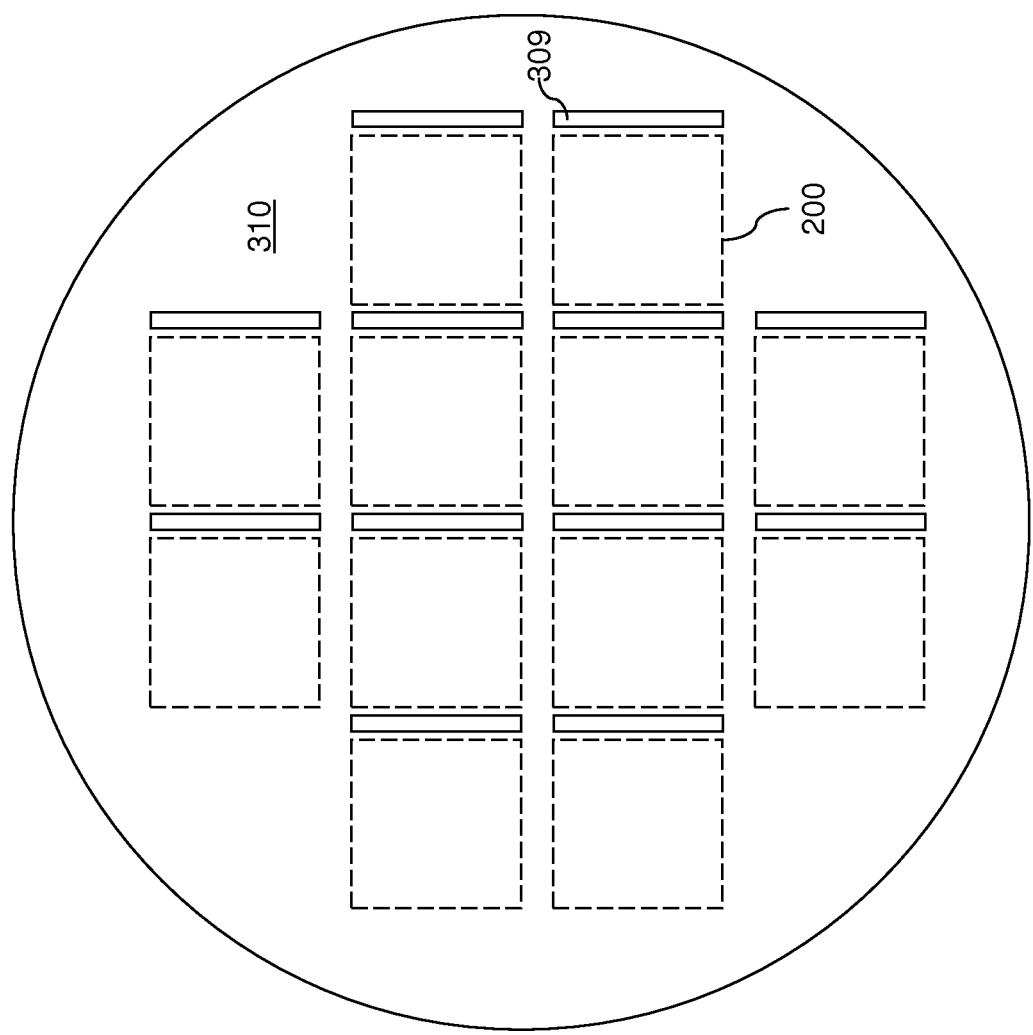
FIG. 19 is a top-down view of a second exemplary template according to an embodiment of the present disclosure.

Referring to FIG. 19, a template 310 according to another embodiment of the present disclosure is illustrated. A plurality of template openings 309 is provided as a two-dimensional periodic array of openings having a periodicity in two horizontal directions. The width of each template openings 309 correspond to the first lateral dimension ld1. The locations of the plurality of semiconductor chips 200 are schematically illustrated with dotted lines, which do not correspond to the sidewalls of the semiconductor chips 200. The plurality of template openings 309 may be located only at one side of each semiconductor chip 200.

Figure 20:
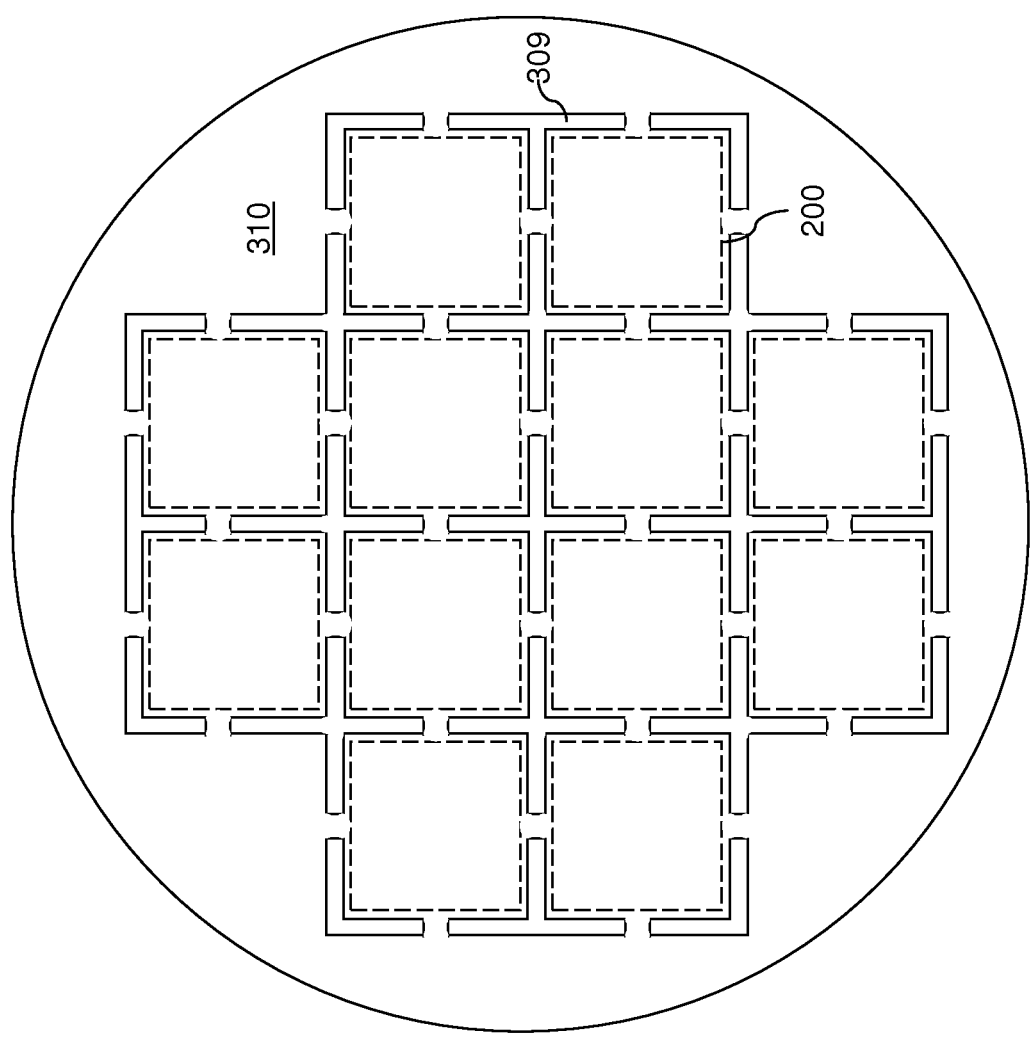
FIG. 20 is a top-down view of a third exemplary template according to an embodiment of the present disclosure.

Referring to FIG. 20, a template 310 according to yet another embodiment of the present disclosure is illustrated. A plurality of template openings 309 is provided as a two-dimensional periodic array of openings having a periodicity in two horizontal directions. The width of each template openings 309 correspond to the first lateral dimension ld1. The plurality of template openings 309 may be located at each corner and at each side of the topmost semiconductor chips 200 provided that the template 310 can remain an integral structure, i.e., a single contiguous structure.

Figure 21:
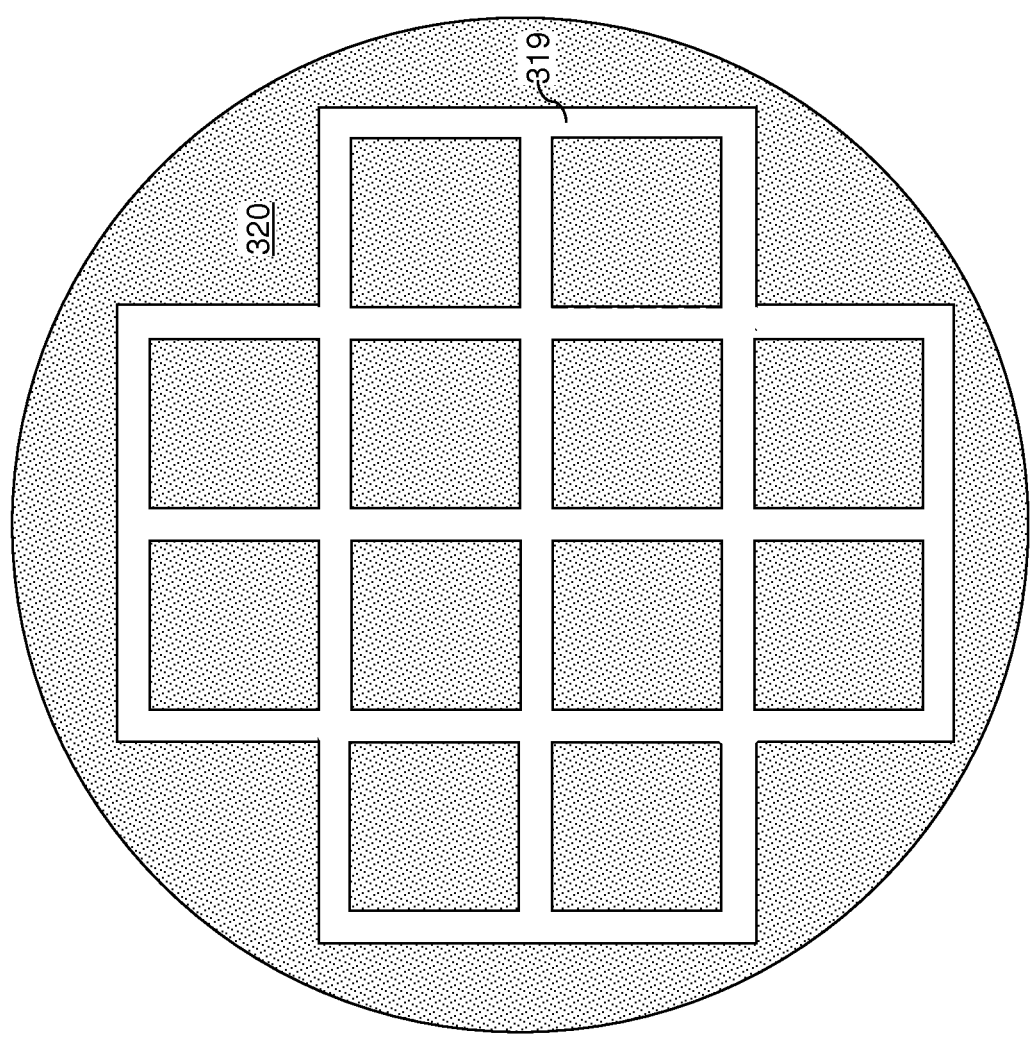
FIG. 21 is a top-down view of an exemplary compliant material layer according to an embodiment of the present disclosure.

Referring to FIG. 21, a compliant material layer 320 that can be employed in conjunction with a template 310 of FIG. 18, 19, or 20 is illustrated. The compliant material layer 320 can have compliant material openings 319 that overlie the lateral gaps among the semiconductor chips 200 that can be disposed underneath.

The plurality of semiconductor chips 200 can be arranged with higher density in the configurations of the present disclosure compared to prior art configurations that require injector tips to be inserted into lateral gaps below the topmost surface of the plurality of semiconductor chips 200. Thus, the methods of the present disclosure can reduce the production cost for the process of bonding semiconductor chips 200 to an interposer substrate or other types of substrates.

While the disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the disclosure is intended to encompass all such alternatives, modifications and variations which fall within the scope and spirit of the disclosure and the following claims.

What is claimed is:

1. A structure comprising:
   a bonded structure including a plurality of semiconductor chips bonded to a substrate; and
   a template disposed over said bonded structure, said template including a plurality of template openings extending between a proximal surface and a distal surface of said template, wherein each of said plurality of template openings has a first lateral dimension at said proximal surface and has a second lateral dimension that is greater than said first lateral dimension at said distal surface, wherein said distal surface is more distal from said bonded structure than said proximal surface, wherein each template opening among said plurality of template openings overlies a gap between a neighboring pair of semiconductor chips among said plurality of semiconductor chips.

2. The structure of claim 1, wherein said template is configured to accommodate an injector head over a template opening among said plurality of template openings.

3. The structure of claim 2, further comprising a compliant material portion disposed between said template and said injector head, wherein said compliant material portion provides a seal between said template and said injector head.

4. The structure of claim 2, wherein said injector head includes an injector tip configured to extrude said underfill material, wherein a lateral dimension of an opening in said injector tip is greater than a lateral spacing among said plurality of semiconductor chips.

5. The structure of claim 4, wherein said lateral dimension corresponds to an inner diameter of said injector tip.

6. The structure of claim 1, further comprising an underfill material extending at least from said template opening and filling a gap within said bonded structure.

7. The structure of claim 1, wherein each of said plurality of template openings has a non-zero taper angle relative to a surface normal of said distal surface between said distal surface and said proximal surface.

8. The structure of claim 1, further comprising a gas dispenser disposed over another template opening among said plurality of template openings.

9. The structure of claim 1, further comprising:
   at least another injector head disposed over at least another template opening among said plurality of template openings; and
   an underfill material supply system configured to provide said underfill material to said injector head and said at least another injector head.

10. The structure of claim 1, wherein said plurality of template openings is a two-dimensional periodic array of openings having a periodicity in two horizontal directions.

11. The structure of claim 1, further comprising a compliant material layer including at least one lower compliant material portion and disposed directly on said plurality of semiconductor chips and said template.

12. The structure of claim 11, wherein said compliant material layer includes a plurality of compliant material openings that overlie lateral gaps among said plurality of semiconductor chips.

13. The structure of claim 12, wherein said plurality of template openings overlies said plurality of compliant material openings.

14. The structure of claim 13, wherein said plurality of compliant material openings have a lateral dimension that is greater than a lateral spacing among said plurality of semiconductor chips.

15. The structure of claim 1, further comprising an adhesive layer disposed directly on said plurality of semiconductor chips and said template layer.

16. The structure of claim 15, wherein said adhesive layer comprises a plurality of adhesive layer openings that underlie said plurality of template openings.

17. The structure of claim 16, wherein said plurality of adhesive layer openings overlies lateral gaps among said plurality of semiconductor chips.

18. The structure of claim 1, wherein said plurality of semiconductor chips comprises a plurality of vertical stacks of two or more semiconductor chips.

* * * * *